(12) United States Patent
Sousa et al.

(10) Patent No.: US 8,048,713 B2
(45) Date of Patent: Nov. 1, 2011

(54) PROCESS FOR MANUFACTURING A CBRAM MEMORY HAVING ENHANCED RELIABILITY

(75) Inventors: Véronique Sousa, Grenoble (FR); Cyril Dressler, Tullins (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/250,045

(22) Filed: Oct. 13, 2008

(65) Prior Publication Data

US 2009/0098681 A1    Apr. 16, 2009

(30) Foreign Application Priority Data

Oct. 16, 2007 (FR) .................................... 07 58363

(51) Int. Cl.
*H01L 21/06* (2006.01)

(52) U.S. Cl. ........ 438/102; 438/758; 438/762; 438/381; 438/382

(58) Field of Classification Search .................. None
See application file for complete search history.

(56) References Cited

U.S. PATENT DOCUMENTS

| | | | |
|---|---|---|---|
| 933,365 A | 9/1909 | Cory et al. | |
| 4,115,872 A | 9/1978 | Bluhm | |
| 4,177,475 A | 12/1979 | Holmberg | |
| 5,363,329 A | 11/1994 | Troyan | |
| 5,761,115 A | 6/1998 | Kozicki et al. | |
| 5,933,365 A | 8/1999 | Klersy et al. | |
| 6,348,365 B1 | 2/2002 | Moore et al. | |
| 6,737,312 B2 * | 5/2004 | Moore | 438/238 |
| 6,855,975 B2 * | 2/2005 | Gilton | 257/296 |
| 6,864,521 B2 | 3/2005 | Moore et al. | |
| 6,864,522 B2 | 3/2005 | Krieger et al. | |
| 6,878,569 B2 | 4/2005 | Li | |
| 6,953,720 B2 * | 10/2005 | Moore et al. | 438/238 |
| 6,985,378 B2 | 1/2006 | Kozicki | |
| 7,050,327 B2 | 5/2006 | Campbell | |
| 7,071,021 B2 | 7/2006 | Harshfield et al. | |
| 7,279,418 B2 * | 10/2007 | Bechevet et al. | 438/666 |
| 7,332,401 B2 * | 2/2008 | Moore et al. | 438/381 |
| 2002/0127886 A1 | 9/2002 | Moore et al. | |
| 2003/0027398 A1 * | 2/2003 | Maimon et al. | 438/382 |
| 2003/0043631 A1 | 3/2003 | Gilton et al. | |
| 2003/0045049 A1 | 3/2003 | Campbell et al. | |
| 2003/0052330 A1 | 3/2003 | Klein | |
| 2003/0123282 A1 | 7/2003 | Nickel et al. | |

(Continued)

FOREIGN PATENT DOCUMENTS

JP         62-205598 A        9/1987

(Continued)

OTHER PUBLICATIONS

Wang et al; "Structure and property characterization of Bi2-xSbxTe3 thermoelectric films prepared by electrodeposition" WUJI Cailiao Xuebao-Journal of Inorganic Materials, Beijing, CN, vol. 20, No. 5, Sep. 2005, pp. 1234-1238.

(Continued)

*Primary Examiner* — Ha Tran T Nguyen
*Assistant Examiner* — Shantanu C Pathak
(74) *Attorney, Agent, or Firm* — Pearne & Gordon LLP

(57) ABSTRACT

The invention relates to a process for manufacturing a plurality of CBRAM memories, each comprising a memory cell in a chalcogenide solid electrolyte, an anode, and a cathode, the process comprising implementing a sublayer of a high thermal conductivity material, higher than 1.3 W/m/K, which covers the set of contacts, then providing, on said sublayer, a triple layer comprising a chalcogenide layer, then an anodic layer, and a layer with second contacts (36), and finally an etching step.

17 Claims, 5 Drawing Sheets

U.S. PATENT DOCUMENTS

| | | | |
|---|---|---|---|
| 2003/0209728 A1 | 11/2003 | Kozicki et al. | |
| 2003/0209971 A1 | 11/2003 | Kozicky | |
| 2004/0157417 A1 | 8/2004 | Moore et al. | |
| 2004/0192006 A1 | 9/2004 | Campbell et al. | |
| 2004/0228164 A1* | 11/2004 | Gilton | 365/154 |
| 2005/0104105 A1* | 5/2005 | Campbell | 257/295 |
| 2005/0127524 A1 | 6/2005 | Sakamoto et al. | |
| 2005/0128794 A1* | 6/2005 | Sussner | 365/158 |
| 2005/0148150 A1* | 7/2005 | Moore et al. | 438/381 |
| 2005/0162907 A1 | 7/2005 | Campbell et al. | |
| 2006/0046444 A1* | 3/2006 | Campbell et al. | 438/510 |
| 2006/0099822 A1* | 5/2006 | Harshfield et al. | 438/758 |
| 2007/0072125 A1 | 3/2007 | Sousa et al. | |
| 2007/0148882 A1 | 6/2007 | Dressler et al. | |
| 2008/0007997 A1 | 1/2008 | Sousa | |

FOREIGN PATENT DOCUMENTS

| | | |
|---|---|---|
| WO | 03/019691 A2 | 3/2003 |
| WO | 03/020998 A2 | 3/2003 |
| WO | 2006/034946 A1 | 4/2006 |

OTHER PUBLICATIONS

Neale; "Micron to look again at non-volatile amorphous memory" Electronic Engineering, Morgan Grampian LTD, London, GB, vol. 74, Apr. 2002, pp. 56-64.

Anonymous; "Copper, CU; Annealed" MATWEB Datasheet, [Online] XP002476474 URL: http://wwwk.matweb.com/search/datasheet_print.aspx?matid=28>.

Anonymous; "Silver, Ag" MATWEB Datasheet, [Online] XP002476475 URL: http://www.matweb.com/search/DataSheet.aspx?MatID=2>.

Anonymous; "Tellurium, Te" MATWEB Datasheet, [Online] XP002476476 URL: http://www.matweb.com/search/datasheet_print.sapx?matid=113>.

French Search Report.

Bychkov et al; "Percolation transition in Ag-doped germanium chalcogenide-based glasses: conductivity and silver diffusion results" Journal of Non-Crystalline Solids 208 (1996).

Kawasaki et al; "Ionic conductivity of $Ag_x(GeSe_3)_{1-x}$ ($0<x<0.571$)glasses" Solid State Ionics 123 (1999) pp. 259-269.

Romero et al; "A transmission electron microscope study of metal/chalcogenide amorphous thin films", Applied Surface Science 234 (2004) pp. 369-373.

Calas et al; "Study of isotopic silver dissolution in vitreous GeSe thin films from secondary ion mass spectrometry measurements" Materials Science and Engineering, B13 (1992) pp. 309-317 XP-002476161.

\* cited by examiner

PROCESS FOR MANUFACTURING A CBRAM MEMORY HAVING ENHANCED RELIABILITY

TECHNICAL FIELD AND PRIOR ART

The invention relates to the field of rewritable memories, and more particularly non volatile rewritable memories.

The invention applies in particular to CBRAM non volatile rewritable memories.

According to the target applications and performance, different types of memories are used.

When very fast writing times are required (such as for a microprocessor calculation, for example), SRAM memories consisting of arrangement of several transistors are used.

The drawback of these memories is that they are volatile and the memory point size, relatively large, does not have a large storage capacity.

In order to have a large storage capacity, DRAM memories are used, consisting of storing electric loads on a capacitance.

These memories have longer writing times (some 10 ns) and they also are volatile, with an information retention time of about some 10 ms. Lastly, for applications requiring information storage even turned off, EEPROM memories or FLASH memories are used, allowing loads to be stored on a field effect transistor floating grid. These memories are non volatile. The drawbacks of this type of memory are the long writing times (some microseconds) and a limited cyclability at 10E6 writing cycles.

The operation principle of currently used rewritable non volatile memories (EEPROM or FLASH memories) is to store electric loads on a field effect transistor floating grid.

Each memory point is thus made of one or more silicon components having a reduced size leading to a reduction of the reading signal and a reduction of the information retention time. It is thus understood that the density of such memory type is limited.

In addition, these memories have relatively long writing times (some microseconds) because it is the time required for the electrons to cross the floating grid by a tunnel effect.

These memories also have a limited cyclability ($10^6$). Indeed, the retention reduces as writing cycles take place because the creation of defects in the oxide allows electrons to leak from the floating grid.

Different memory concepts are considered for new generations of rewritable non volatile memories.

Active materials may be ferroelectric (FERAM memories), or magnetic (MRAM memories), or phase changing (PC-RAM memories) or ionic conduction (PMC memories) materials.

The invention more particularly relates to the field of CBRAM and PMC memories. A PMC memory cell according to the prior art is shown in FIG. 1.

The operation principle of PMC memories is based on ion (for example $Ag+$) migration in a solid electrolyte 4 (for example GeSe) positioned between a cathode 6 (for example of Ni) and a soluble anode 8 (for example of Ag).

Reference 14 refers to an insulating medium.

The reading signal results from the electric resistivity difference between two states ON and OFF.

In the OFF state, ions are dispersed in the array 4, providing a large resistivity phase. By applying a potential difference of some 100 mV between the anode 8 and the cathode 6, as a pulse of some 10 ns, ions migrate towards the cathode 6, providing a metal deposition. A low resistivity ON state is thus achieved.

By applying a potential difference of the same intensity and time but also with opposed signs, the metal deposition is dissolved again as ions in the electrolyte 4 and the OFF state is achieved again.

The major advantage of PMC memories is that writing voltages, smaller than 1V, are low in comparison with the voltages of other non volatile memories (EEPROM, MRAM, PCRAM).

DESCRIPTION OF THE INVENTION

In order to achieve reliable CBRAM memory point arrays, a homogeneous distribution of the anodic material 8 is sought. This is very difficult because $Ag+$ ions are very mobile, particularly when they are subjected to electric stresses.

The inventors have found that on manufacturing such a layer, for example of Ag by sputtering, thermal gradients will appear in layer 4 of chalcogenide material: the upper surface, subjected to the bombardment, receives a certain amount of energy which dissipates as heat and causes a temperature rise. The temperature rise is different according to the substrate thermal conductivity which comprises different structures in the considered area (a metal portion corresponding to the cathodes 6 on the one hand and the side insulator on the other hand). The chalcogenide materials based on Se having very strong thermal electric coefficients (~1 mV/K for Se), the thermal gradients induce potential differences, with the colder areas charging negatively and thus attracting $Ag+$ ions.

It can be shown that these areas are, for example, the surface of tungsten plugs (providing the cathodes 6), as illustrated in FIG. 2 which shows a simulation of the temperature profile while providing energy on a known type memory surface. In this figure, areas 6, 4 (chalcogenide, here AgGeSe) are identified.

As illustrated in FIG. 3, it can be seen, during the process of providing the memory points, a silver Ag cluster 17, which may lead to deformations of layers and short-circuits between the lower and upper contacts in the device. References 19 and 21 refer to excessive silver remaining on the substrate in the areas facing the insulating substrate.

The problem is thus to find a new process allowing such problems to be cancelled, or at least reduced.

The invention tries to solve this problem.

It particularly relates to a process for manufacturing a plurality of CBRAM memories, each comprising a memory cell in a chalcogenide solid electrolyte, an anode and a cathode, wherein the process comprises:

a) providing, on a semiconductor support, an insulating layer, b) providing, in said insulating layer a set of first contacts, each for one of the memory points, c) providing, on said layer and said contacts, a sublayer or barrier made of a high thermal conductivity material, higher than 1.3 W/m/K, which covers the set of first contacts, d) providing, on said sublayer, a triple layer comprising a chalcogenide layer, then an anodic layer, and layer of second contacts, e) an etching step between the areas located above the first contacts, in order to provide individual memory points, electrically insulated from each other.

During a process according to the invention, the thermal gradients in the chalcogenide material are reduced, by providing a consistent sublayer having high or strong thermal conductivity.

This sublayer, which may function as an inert cathode, may be etched simultaneously with the active stacking. In this configuration, the thermal gradients, and therefore the electric gradients, are lower than in currently known structures. In accordance, less anodic material accumulation on the contacts, and thus less short-circuits in devices are observed.

During step d), a triple layer is provided on said sublayer made of a high thermal conductivity material, said triple layer comprising a chalcogenide layer, then an anodic layer, and a layer of second contacts. At any point of the sublayer, this triple layer is separated from the support, on the one hand by the sublayer of high thermal conductivity material and on the other hand by either the first contacts or by the insulating layer.

The anodic layer is preferably made of pure silver.

According to an embodiment, step b) comprises:
  a step of providing a metal layer over the insulating layer etched to provide the first contacts,
  a step of polishing said metal layer, up to the insulating layer and the first contacts.

According to another embodiment, steps b) and c) comprise:
  a step of providing a metal layer over the insulating layer etched to provide the first contacts,
  a step of polishing said metal layer, which leaves a residual layer, which forms the sublayer made of a high thermal conductivity material.

The chalcogenide may be based on Se.

It may be doped with a metal; for example, it is of the AgGeSe type or of the AgGeSbSe type or of the AgGeS or AsS or AsSe type.

A CBRAM memory structure achieved by a process according to the invention has an enhanced reliability.

The invention also allows the topography to be reduced at memory points, since the effects resulting of metal clusters at the cathodes are also alleviated.

DETAILED DESCRIPTION OF PARTICULAR EMBODIMENTS

A first example of a process according to the invention, for manufacturing PMC memories, shall be described in reference to FIGS. 5A-5E.

Figure 5A:
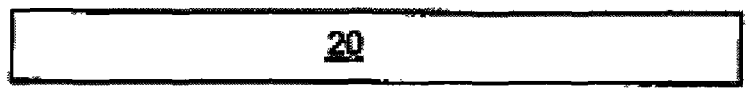
FIGS. 5A-5G show steps for carrying out a process according to the invention.

A substrate 20, for example made of silicon, is first selected (FIG. 5A). This substrate may contain components, not shown in the figure. Transistors addressing future memory points could have previously been made in this substrate.

Figure 4:
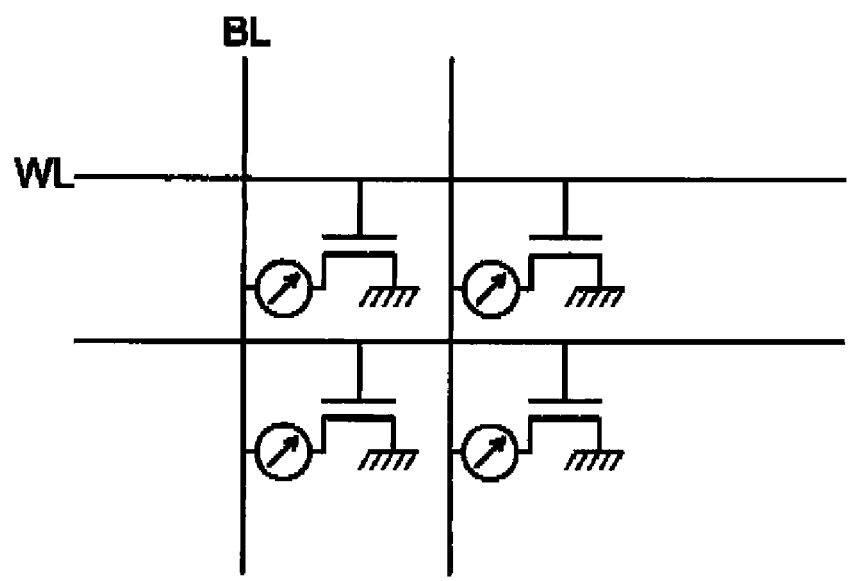
FIG. 4 is a schematic view of a PMC memory array.

FIG. 4 shows a 4 PMC memory point array according to the invention, controlled by WL line and BL column signals.

Figure 5B:
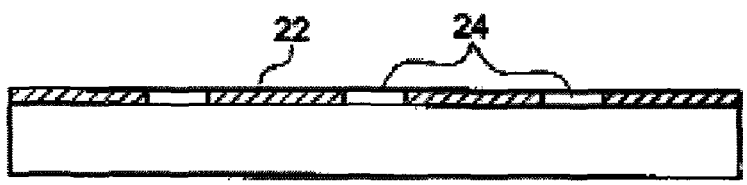
Figure 5C:
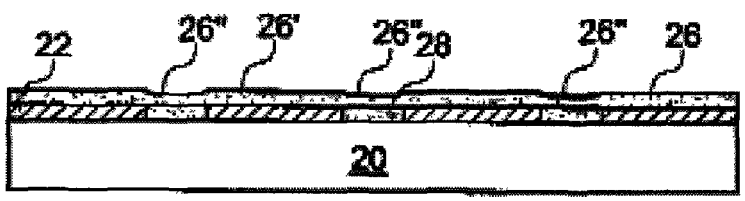
Figure 5D:
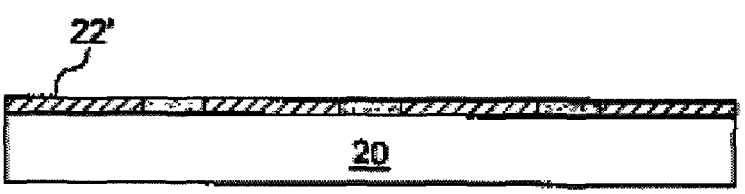

A layer 22 made of an insulating material, for example a SiO2 oxide layer, or Si3N4 nitride layer, is then provided on this substrate 20. Then, openings 24 are etched in this layer 22 up to the surface of the substrate 20 (FIG. 5B). These openings will localize the future memory points.

A metal layer 26 then covers the set and metal coatings 28 simultaneously fill in the previously etched openings 24. As a matter of fact, the coating 26 thus made is a conformal coating: the surface 26' is not uniformly flat; on the contrary, it reproduces the cavities 24 where or above which it can slightly collapse (see areas 26" of FIG. 5C). The coatings 28 provided in the cavities 24 shall become the contacts of each of the individual memory points.

A polishing step is then carried out, for example, a mechanical chemical polishing (FIG. 5D) up to a surface 22', which is either the surface of the layer 22, or a surface attained by etching up to a level lower than the level defined by the initial surface of the layer 22. The free portion of the coatings 28 is flush with this surface 22'.

Figure 5E:
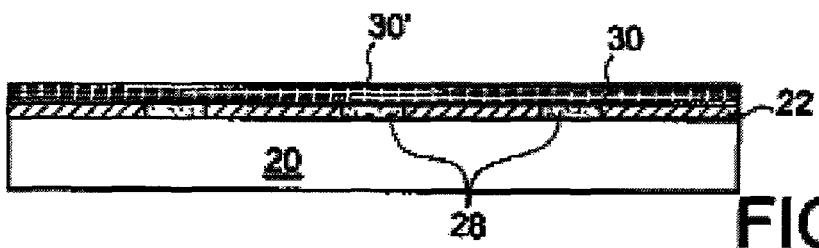

On such surface 22', a layer 30 may be consistently provided (FIG. 5E). This layer material has a thermal conductivity higher than that of the chalcogenide material which will then be deposited; such thermal conductivity is thus preferably of 1.3 W/m/K or, more preferably higher than this value, for example higher than 50 W/m/K or than 100 W/m/K; it is, for example, a well conductive metal material or carbon. The different previously made contacts 28 are all connected and in contact through the same layer 30.

In order to be continuous, the latter has at least the same thickness of an atomic layer, but it preferably has a thickness of at least 1 nm, and even more preferably, larger than 5 nm so that the thermal properties thereof be consistent in the substrate plane on which it is made. The upper limit of the layer 30 thickness is a function of the material thereof, but also of the chalcogenide material used thereafter for the memory points. For example, it is such that the serial resistance it provides does not exceed the on state resistance of the future memory cell, that is some 10 k$\Omega$, for example 20 k$\Omega$, or 50 k$\Omega$. Typically, the thickness thereof is below 50 nm.

Figure 5F:
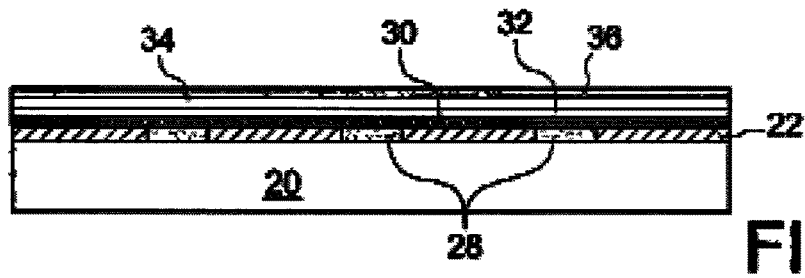
Figure 9:
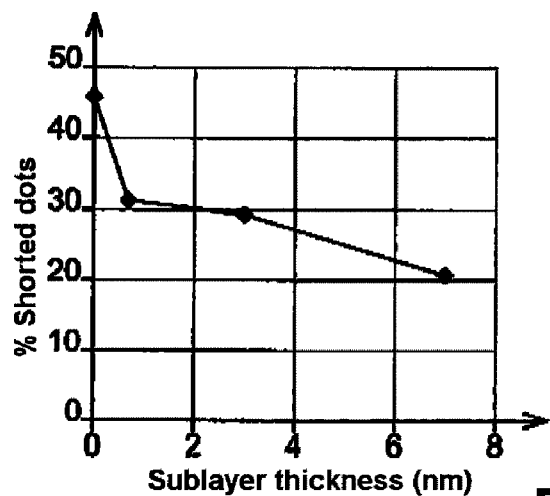
FIG. 9 shows the evolution of the number of short-circuited devices, according to the barrier sublayer thickness.

The surface 30' of this layer 30 may function as a starting surface for implementing different steps of providing PMC memory points. A chalcogenide layer 32, then an anodic layer 34, for example of silver (as pure as possible) or of copper, and lastly a layer 36 of contacts (FIG. 5F) may thus be deposited on this surface 30'. In these steps, it can be seen that, thanks to the sublayer 30, the atomic migration of the anodic layer 34 is drastically reduced. As can be seen in FIG. 9 (described below), a beneficial effect may be noticed, even with the smallest thicknesses of the sublayer 30, particularly from a thickness of 0.5 nm or 0.7 nm.

Figure 5G:
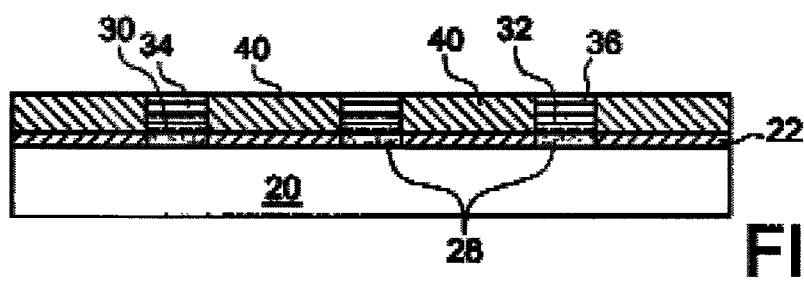

The stacking thus built may then be subjected to photolithography and etching operations between the areas located at the memory points, that is between the areas, or studs, located just above the contacts provided by the coatings 28 (FIG. 5G). This etching step will allow portions of the sublayer 30 connecting the different memory point contacts 28 with each other to be removed. Individual studs or memory points, electrically insulated from each other, are thus achieved. However, each of these points keeps track of the manufacturing process, because of a residual portion of the sublayer 30. Reference 40 refers to an insulating material (for example SiO2) which may be deposited, then planarized, between the different memory points thus achieved.

Figure 6A:
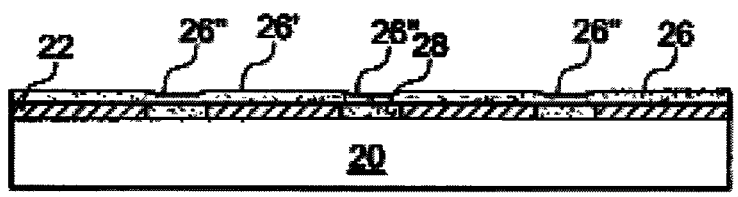
FIGS. 6A and 6B are steps of an alternative process according to the invention.
Figure 6B:
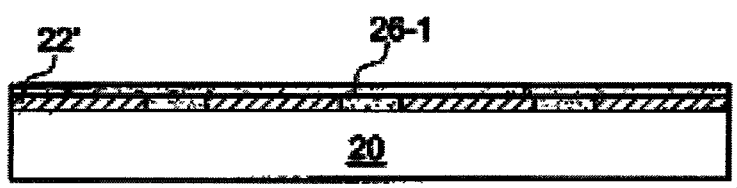

An alternative to the above mentioned process shall be explained with FIGS. 6A and 6B. FIG. 6A is by the way the same as FIG. 5C, but the material of the layer 26 is a material on which the triple layer 32, 34, 36 may be directly deposited, after a polishing operation which, this time, shall not be implemented up to the surface 22' and shall thus leave a layer 26-1 (FIG. 6B). The thermal conductivity of the material of the layer 26 is thus high, of 1.3 W/m/K or more or, even more preferably, higher than 50 W/m/K or even to 100 W/m/K. It is, for example, a well conducting metal material or carbon. The previously manufactured contacts 28 are all connected and in contact through the same sublayer 26-1. The thickness of the latter is, as it has already been explained above for the layer 30, at least of 1 nm and, even more preferably, higher than 5 nm and lower than 50 nm, and may be selected according to the same criteria (the serial resistance of the layer 26-1 does not exceed the resistance in the "on" state of the future memory cell, that is some 10 kΩ, for example 20 kΩ or 50 kΩ). Then, the steps of FIGS. 5F and 5G may be implemented successively. The advantage of this alternative is that it is not required to deposit a new layer 30 after polishing up to the surface 22'.

In accordance, whatever the alternative implemented, the chalcogenide layer 32 is deposited on a surface 30 or 26-1 with a consistent temperature and a high thermal conductivity.

The atomic migration of the anodic layer 34 is drastically reduced by a process according to the invention; such process thus allows, in particular, an anodic layer made of the purest possible silver to be manufactured, which avoids the necessity of using, for the anode material, materials such as silver selenide AgSe.

With the calculation below, the distance travelled by silver atoms in GeSe under a thermoelectric effect can be evaluated.

First, the number of n-loaded atoms may be evaluated.
In atomic volume ($cm^3$/mol):
silver: 10.3 $cm^3$/mol,
germanium: 13.6 $cm^3$/mol,
selenium: 16.5 $cm^3$/mol,
the molar volume of chalcogenide $Ag_{33}Ge_{17}Se_{50}$ may be obtained: ~1396 $cm^3$/mol (that is $7.16 \times 10^{-4}$ mol/$cm^3$).

In a saturated state, the chalcogenide material accepts up to 33% of Ag atoms, among which 20% are mobile. There are $4.7 \times 10^{-3}$ mol of mobile Ag atoms per $cm^3$, that is about $n=2.85 \times 10^{21}$ at/$cm^3$ of mobile Ag atoms. The mobility of these atoms may be evaluated as follows:

Let σ be the electric conductivity (about $3 \times 10^{-4}$ $Ω^{-1} \cdot cm^{-1}$), q the elementary load of loaded atoms ($=1.6 \times 10^{-19}$ C), n the density of loaded atoms ($2.85 \times 10^{21}$ $cm^{-3}$), m the mobility (in $m^2 V^{-1} \cdot s^{-1}$) then:

$$σ = q\, n\, μ$$

$$μ = σ/q\, n = 3 \times 10^{-2}/(1.6 \times 10^{-19} \cdot 4 \times 10^{27}) = 6.6 \times 10^{-11}\ m^2 \cdot V^{-1} \cdot s^{-1}$$

Δl (travelled distance) and t (travelling time) can also be evaluated. Let v be the travelling velocity of ions, μ their mobility, ΔV the electric potential gradient and E the electric field then:

$$v = Δl/t = μ \cdot E,\ \text{and}\ E = ΔV/Δl$$

leads to:

$$Δl = \mathrm{sqrt}(μ \cdot ΔV \cdot t)$$

$$t = Δl^2/μ/ΔV$$

For Se-based components, the thermal electric effect may then be calculated, with a gradient on 1 μm. Let S be the thermal electric coefficient (in mV/K, S=+1 mV/K for Se) then:

$$ΔT = 1K \Longrightarrow ΔV = 1\ mV\ \text{and}\ t = 15\ s.$$

Figure 1:
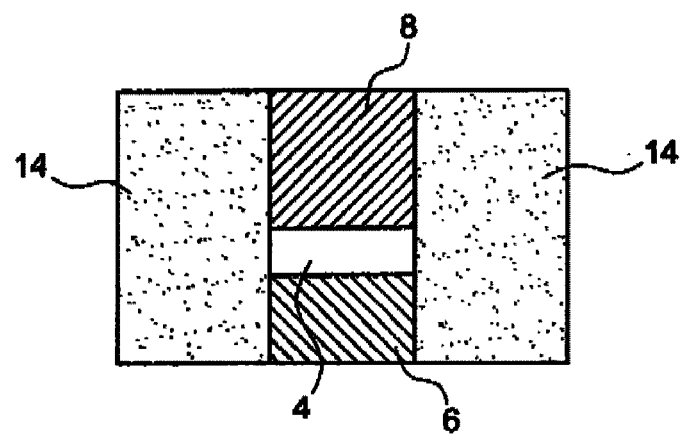
FIG. 1 shows a known PMC device.
Figure 2:
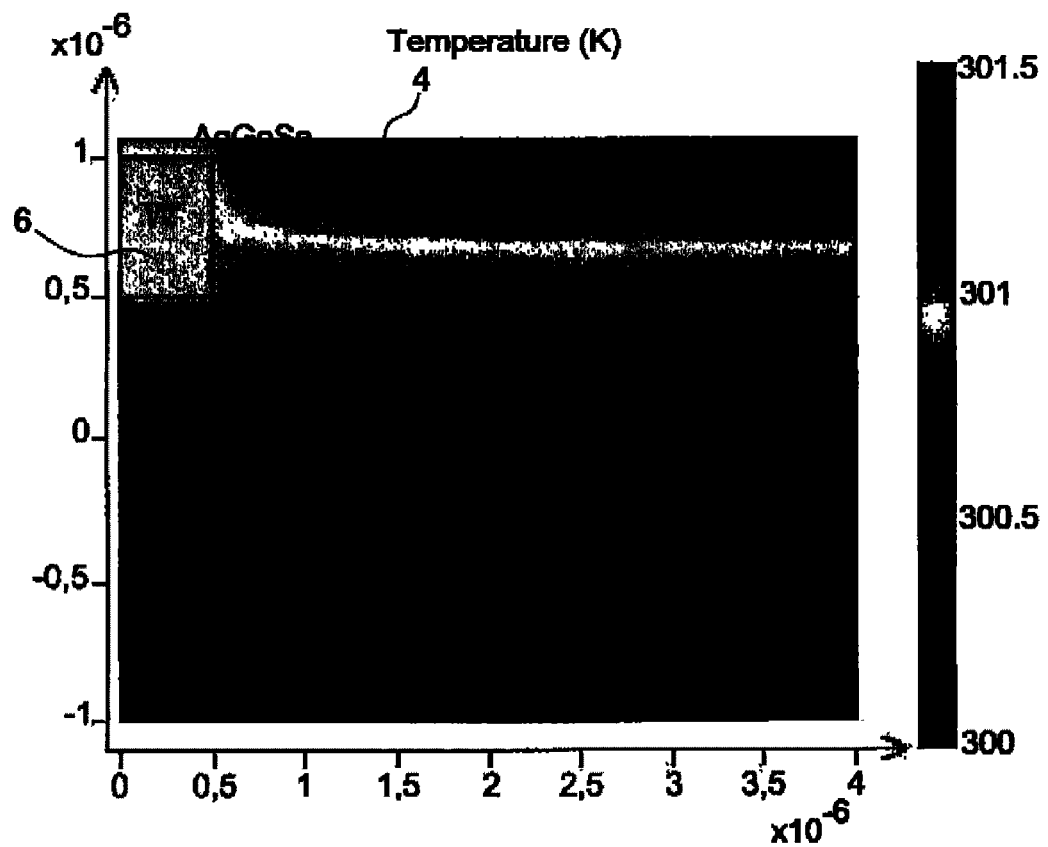
FIG. 2 shows a simulation of the temperature profile while providing energy on the surface, in a known process.
Figure 3:
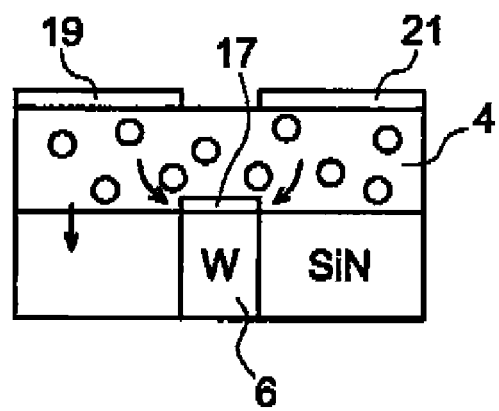
FIG. 3 is a block diagram of the Ag clustering on contact studs.

This calculation shows that if a temperature deviation of 1K appears on a 1 μm distance, about 20 s will be necessary for the silver to reach that distance. The deposition time is of about one minute, which explains Ag depleted areas appearing on an extension of at least one micrometer around the tungsten plugs 6 (see FIG. 3). The solution to this problem is precisely to implement a process according to this invention, particularly according to one of the above mentioned alternatives.

The thickness and material of the layer 30 may also be optimized by electrothermal stimulation, which may be implemented, for example, with a commercial multi physical modelling software, such as, for example FEMLAB software.

Figure 7A:
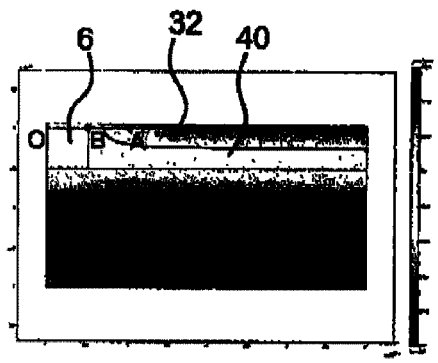
FIGS. 7A and 7B show a calculated temperature distribution in a CBRAM structure without any barrier layer and, according to the invention, with a barrier layer.
Figure 7B:
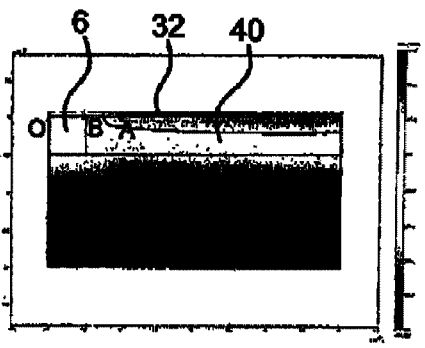

Modelling results, which allow the influence of the sublayer 30 to be illustrated, are given in FIGS. 7A and 7B, showing the temperature distribution calculated for a CBRAM stacking, without a sublayer (FIG. 7A) and with a sublayer (FIG. 7B). This calculation was made for a (tungsten) sublayer 30 with a thickness of 10 nm and a thermal conductivity of 174 Wm/K tungsten conductivity).

In these figures, a (tungsten) stud 6 may be seen, whereas reference 40 corresponds to the surrounding ($SiO_2$) insulating material. The layer 32 is of chalcogenide. Two points A and B are identified in these figures: point B is located at the boundary between the conductive stud, the insulating area and the chalcogenide layer 32, whereas point A is situated at the boundary of the insulator and the chalcogenide.

Figure 8:
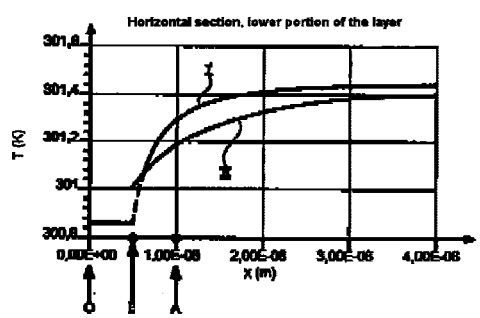
FIG. 8 is a temperature profile along a side direction, at the lower interface of the chalcogenide material layer, in a CBRAM structure without a barrier layer and, according to the invention, with a barrier layer.

FIG. 8 shows two temperature profiles (K), along a direction following the lower limit of the chalcogenide layer 32, from point O (see FIGS. 7A and 7B) located at the interface between the chalcogenide layer and the stud.

Profile I corresponds to the case of FIG. 7A, without a sublayer 30, whereas profile II corresponds to the case of FIG. 7B, with a sublayer 30. This second profile is apparently more squeezed than the first one, it has a maximum magnitude of 0.4K, whereas the first one has a magnitude of about 0.8K. Concerning both points A and B, the temperature at point A is apparently reduced when profile I is passed to profile II, whereas the temperature at point B rises: in accordance, an overall temperature squeezing, or smoothing, takes place when a sublayer 30 or 26-1 is inserted in the stack, according to the invention. This temperature smoothing allows the clustering phenomena, as described above, with a particular reference to FIG. 3, to be drastically reduced.

CBRAM devices have been manufactured with a barrier 30 having a lower carbon content. Different barrier thicknesses have been tested, from 0.7 to 7 nm. The active stacking is as follows:
  a carbon layer 30, with different thicknesses of 0.7 nm, 3 nm or 7 nm,
  a chalcogenide GeSe layer 32, with a thickness of 55 nm,
  an Ag layer 34, with a thickness of 40 nm,
  a layer 36 with Au contacts, with a thickness of 140 nm.
Devices with a known structure, without a carbon layer 30, have further been manufactured.

FIG. 9 shows the proportion of short-circuited devices, in manufacturing output, according to the thickness of (carbon) sublayer 30. A short drop of the rate of short-circuits in devices can be noticed when the thickness of layer 30 rises: this rate goes from a value between 45% and 50% for devices without a sublayer 30 or 26-1 to about 30% for a sublayer having a thickness of substantially 0.7 nm (at point A in the figure; 0.7 nm corresponding to one of the tested thicknesses, see above). Then, up to a thickness of about 3 nm, the proportion appears to remain substantially the same, then it again substantially decreases above 3 nm. For a thickness above 3 nm or 4 nm, it reaches a value substantially between 20% and 30%. The number of defective devices is thus approximately divided by an average factor of 2 thanks to the lower barrier 30. When the thickness of the layer 30 is above 4 nm or 5 nm, the improvement is above 50%. The invention thus allows functional device efficiency to be increased in a PMC memory point array.

The invention claimed is:

1. A process for manufacturing a plurality of CBRAM memories, each comprising a memory cell in a chalcogenide solid electrolyte, an anode and a cathode, wherein the process comprises:
   a) providing, on a semiconductor support, an insulating layer,
   b) providing, in said insulating layer a set of first contacts, the set of first contacts comprising at least first contact and a second contact that is electrically insulated from the first contact by the insulating layer, wherein each of the first and second contacts forms a portion of a separate memory point,
   c) providing, over said insulating layer and said first and second contacts, a sublayer made of a high thermal conductivity material, higher than 1.3 W/m/K, wherein said sublayer extends over the insulating layer from the first contact to the second contact to cover at least a portion of each of the first and second contacts and the insulating layer separating the first and second contacts to form: (i) a continuous electrically-conductive path that electrically connects the first and second contacts separated by the insulating layer, and (ii) an exposed surface formed uniformly of the high thermal conductivity material that extends over an extent of the insulating layer that extends between the first and second contacts,
   d) providing, on said uniform exposed surface of the sublayer, a triple layer comprising a chalcogenide layer, then an anodic layer, and a layer of second contact, and
   e) etching between areas located above the first and second contacts to remove at least a portion of the high thermal conductivity material forming the electrically-conductive path over the insulating layer electrically connecting the first and contacts to provide individual memory points that are electrically insulated from each other.

2. The process according to claim 1, wherein the sublayer is made of a material having a thermal conductivity higher than 100 W/m/K.

3. The process according to claim 1, wherein the sublayer is made of a metal material.

4. The process according to claim 1, the sublayer having a thickness larger than 1 nm or 5 nm and smaller than 50 nm or 100 nm.

5. The process according to claim 1, wherein the chalcogenide is based on Se.

6. The process according to claim 1, wherein the anodic layer is made of silver.

7. The process according to claim 1, wherein step b) comprises:
   a step of providing a metal layer over the insulating layer etched to provide the first and second contacts, and
   a step of polishing said metal layer, up to the insulating layer and the first and second contacts.

8. The process according to claim 1, wherein steps b) and c) comprise:
   a step of providing a metal layer over the insulating layer etched to provide the first and second contacts,
   a step of polishing said metal layer, which leaves a residual layer, which forms the sublayer made of a high thermal conductivity material.

9. The process according to claim 1, comprising a step of providing addressing transistors in the substrate.

10. The process according to claim 1, wherein the chalcogenide is doped with a metal.

11. The process according to claim 10, wherein the metal doped chalcogenide is of the AgGeSe type or of the AgGeSbSe type or of the AgGeS or AsS or AsSe type.

12. A process for manufacturing a plurality of CBRAM memories, each comprising a memory cell in a chalcogenide solid electrolyte, an anode and a cathode, wherein the process comprises:
   a) providing, on a semiconductor support, an insulating layer, b) providing, in said insulating layer a set of first contacts, the set of first contacts comprising at least a first contact and a second contact that is electrically insulated from the first contact by the insulating layer wherein, each each of the first and second contacts forms a portion of a separate memory point,
   c) providing, on said insulating layer and said first and second contacts, a sublayer made of a carbon-comprising material or a metal material with high thermal conductivity, higher than 100 W/m/K, which continuously covers the first and second contacts and a portion of the insulating layer separating the first and second contacts to establish an electrically-conductive path between the first and second contacts, said sublayer having a thickness larger than 1 nm or 5 nm and smaller than 50 nm or 100 nm,
   d) providing, on said sublayer, a triple layer comprising a chalcogenide layer, of the AgGeSe type or of the AgGeSbSe type or of the AgGeS or AsS or AsSe type, then a silver anodic layer, and a layer of second contact, and
   e) etching between areas located above the first and second contacts, in order to remove at least a portion of the sublayer separating the first and second contacts forming the electrically conductive path between the first contacts to provide individual memory points that are electrically insulated from each other.

13. A process for manufacturing a plurality of CBRAM memories, each comprising a memory cell in a chalcogenide solid electrolyte, an anode and a cathode, wherein the process comprises:
   a) providing, on a semiconductor support, an insulating layer,
   b) providing, in said insulating layer a set of first contacts (28) comprising at least a first contact and a second contact that is electrically insulated from the first contact by the insulating layer, each of the first and second contacts forming a portion of a separate memory point, wherein said providing the first and second contacts comprises: providing a metal layer or a layer comprising carbon over the insulating layer etched to provide the first and second contacts, and polishing said metal layer or said layer comprising carbon up to the insulating layer to form a planar exposed surface comprising portions of exposed insulating layer and exposed metal layer or exposed layer comprising carbon,
   c) after said polishing, providing on said planar exposed surface, a sublayer made of a high thermal conductivity material, higher than 1.3 W/m/K, which covers (i) a portion of the insulating layer extending between the first and second contacts and (ii) the first and second contacts, to establish an electrically-conductive path between the first and second contacts, d) providing, on said sublayer, a triple layer comprising a chalcogenide layer, then an anodic layer, and a layer of second contact, and e) etching between areas located above the first and second contacts, in order to remove at least a portion of the sublayer and provide individual memory points that are electrically insulated from each other.

14. A process for manufacturing a plurality of CBRAM memories, each comprising a memory cell in a chalcogenide solid electrolyte, an anode and a cathode, wherein the process comprises:

a) providing, on a semiconductor support, an insulating layer, b) etching said insulating layer and providing a metal layer or a layer comprising carbon over said insulating layer to provide in said insulating layer a set of first contacts (28) comprising at least a first contact and a second contact that is electrically insulated from the first contact by the insulating layer, each of the first and second contacts forming a portion of a separate memory point, wherein the metal layer or the layer comprising carbon electrically connects the first and second contacts together by forming a conductive path over the insulating layer that extends between the first and second contacts, c) polishing said metal layer or said layer comprising carbon, which leaves a residual layer on said insulating layer and said first and second contacts, said residual layer made of a high thermal conductivity material, higher than 1.3 W/m/K, d) providing, on said residual layer, a triple layer comprising a chalcogenide layer, then an anodic layer, and a layer of second contact, and e) etching between areas located above the first and second contacts, in order to provide individual memory points, electrically insulated from each other.

15. The process according to claim 1, wherein a temperature across an extent of the chalcogenide layer during deposition of the anode layer is substantially-uniform to minimize migration of ions of a material forming the anode layer into the chalcogenide layer.

16. The process according to claim 1, wherein the exposed surface of the sublayer is planar.

17. The process according to claim 1, wherein the sublayer is made of a material comprising carbon.

* * * * *